United States Patent
Mori et al.

(10) Patent No.: US 6,303,495 B2
(45) Date of Patent: *Oct. 16, 2001

(54) METHOD OF FORMING THIN COPPER FILM AND SEMICONDUCTOR DEVICE WITH THIN COPPER FILM

(75) Inventors: Takeshi Mori; Tetsuo Fukada; Makiko Hasegawa; Yoshihiko Toyoda, all of Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/038,117

(22) Filed: Mar. 11, 1998

(30) Foreign Application Priority Data

Mar. 13, 1997 (JP) ................................. 9-059279(P)

(51) Int. Cl.⁷ .................................................... H01L 21/44
(52) U.S. Cl. .......................... 438/660; 438/643; 438/661; 438/680; 438/687
(58) Field of Search .................... 438/679, 628, 438/661, 660, 687, 680, 643, 625, 618, 627, 622

(56) References Cited

U.S. PATENT DOCUMENTS

| | | | |
|---|---|---|---|
| 5,312,509 | * 5/1994 | Eschbach | 156/345 |
| 5,391,517 | * 2/1995 | Gelatos et al. | 438/643 |
| 5,403,772 | 4/1995 | Zhang et al. | 438/166 |
| 5,817,367 | * 10/1998 | Chun et al. | 427/250 |
| 5,851,367 | * 12/1998 | Nguyen et al. | 204/192.34 |
| 5,851,917 | * 12/1998 | Lee | 438/627 |
| 5,886,864 | * 3/1999 | Dvorsky | 361/234 |
| 5,953,634 | * 9/1999 | Kajita et al. | 438/687 |
| 6,139,697 | * 10/2000 | Chen et al. | 204/192.15 |

FOREIGN PATENT DOCUMENTS 2000-91269-A * 3/2000 (JP).

OTHER PUBLICATIONS

"Chemical Additives for Improved . . .", Arthur K. Hochberg, et al., Advanced Metallization for ULSI Applications in 1994, pp. 79–86.

"Interconnection Process Employing Damascene Method", H. Shibata, monthly Semiconductor World, Dec. 1995, pp/ 179–184.

"Blanket Copper CVD from Hexafluoroacetyl acetonato . . . ", J. Rober, et al. Advanced Metallization for ULSI Applications in 1994, pp. 133–137.

* cited by examiner

Primary Examiner—Carl Whitehead, Jr.
Assistant Examiner—Jamie L. Brophy
(74) Attorney, Agent, or Firm—McDermott, Will & Emery (57) ABSTRACT

Copper material is exposed on the surface of a TiN film (an underlying film) formed in the main surface of a silicon substrate with a silicon oxide film interposed. Subsequently, a thin copper film is formed on TiN film. Thus, the thin copper film can be formed on the film including metal with high melting point or nitride thereof with high adhesion by means of CVD.

5 Claims, 6 Drawing Sheets

METHOD OF FORMING THIN COPPER FILM AND SEMICONDUCTOR DEVICE WITH THIN COPPER FILM

BACKGROUND OF THE INVENTION

1. Field of the Invention

The present invention relates to methods of forming thin copper films and semiconductor devices with thin copper films, and particularly to a method of forming a thin copper film on an underlying film including metal with high melting point or nitride thereof by means of CVD (Chemical Vapor Deposition), and a semiconductor device with the thin copper film.

2. Description of the Background Art

Conventionally, material of Al with copper added thereto having high resistance or electromigration resistance has generally been used as interconnection material for an LSI (Large Scale Integration). However, as LSIs are increasingly reduced in size to achieve as small an interconnection width as about 0.15 µm or less, a problem associated with resistance or the like becomes inevitable even if material of Al with copper added is employed for interconnection.

Then, to cope with the interconnection width of about 0.15 µm or less, which will be expected in future, employment of a copper interconnection is considered. Copper is relatively easily diffused, so that it might disadvantageously be diffused in the underlying film by thermal treatment commonly performed in a manufacturing process of the LSI. To avoid such diffusion, a common practice would be to form a diffusion barrier film such as a TiN film under the copper interconnection.

Figure 10:
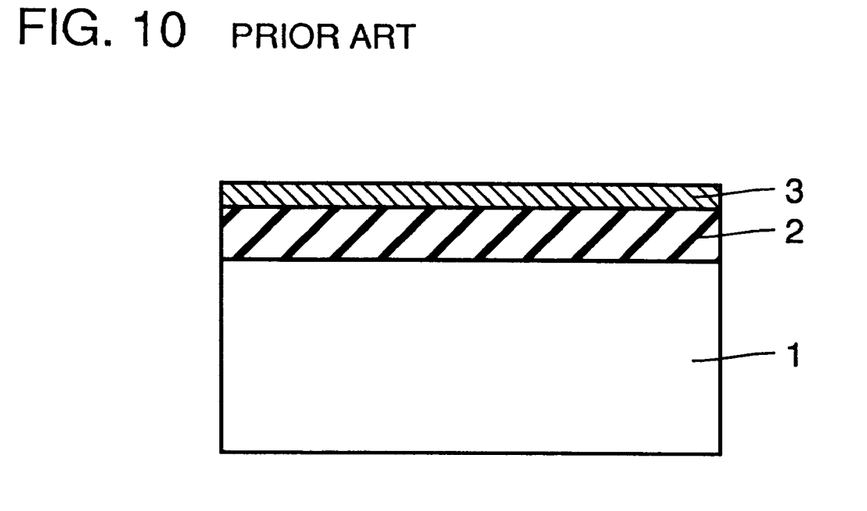
FIGS. 10 and 11 are cross sectional views showing first and second steps in a conventional method of forming a thin copper film.
Figure 11:
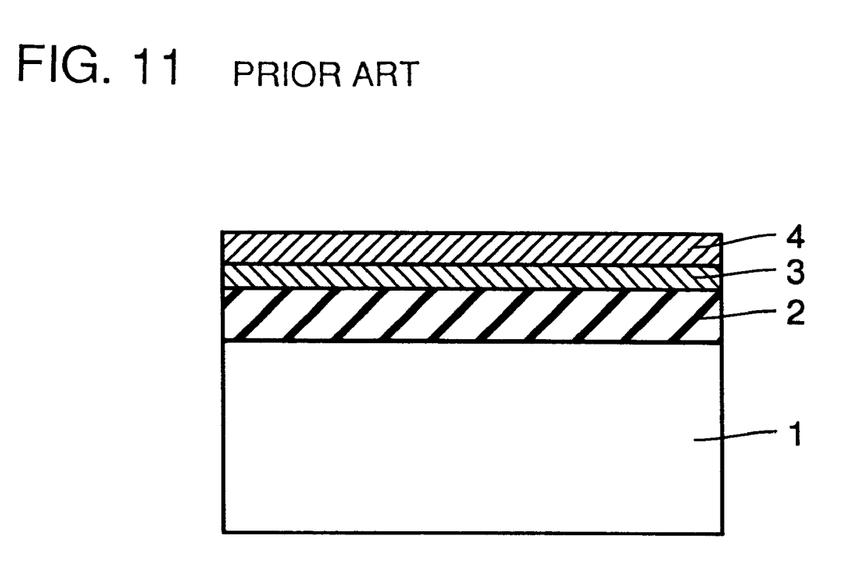

In view of the foregoing, a conventional method of forming a thin copper film on a TiN film will now be described with reference to FIGS. 10 and 11. FIGS. 10 and 11 are cross sectional views showing first and second steps of the conventional method of forming the thin copper film on the TiN film. FIGS. 10 and 11 show a thin copper film 4 formed on a TiN film 3, which has been formed on a silicon substrate 1 with a silicon oxide film 2 interposed.

Referring now to FIG. 10, silicon oxide film 2 and TiN film 3 are sequentially deposited on silicon substrate 1 by means of CVD, for example. Then, as shown in FIG. 11, thin copper film 4 is formed on the TiN film by means of CVD using for example Cu (hfac) (tmvs) without any particular pretreatment. Here, hfac and tmvs are abbreviations of hexafluoroacetylacetonate and trimethylvinylsilane, respectively.

When thin copper film is formed on TiN film 3 using Cu (hfac) (tmvs) by means of CVD without any pretreatment as mentioned above, however, sufficient adhesion is not ensured between thin copper film 4 and underlying TiN film 3 as pointed out in *Advanced Metalization for ULSI Applications*, pp. 79–86, 1994.

SUMMARY OF THE INVENTION

The present invention is made to solve the aforementioned problem. An object of the present invention is to provide a method of forming a thin copper film on an underlying film including metal with high melting point or nitride thereof with high adhesion by means of CVD, and a semiconductor device with the thin copper film.

In the method of forming the thin copper film in accordance with the present invention, the thin copper film is formed on the underlying film including metal with high melting point or nitride thereof. To start with, copper material is kept in close contact with or exposed to the surface of the underlying film. The exposure of copper material is followed by film formation of the thin copper film on the underlying film. It is noted that in the present description, "exposure" is defined as a treatment for applying material such as copper material on the underlying film while avoiding reaction therewith. In addition, the above mentioned "film formation" is defined as a process for forming a film such as the thin copper film by reaction of material with the underlying film.

It is noted that, preferably, the above mentioned underlying film is formed on a substrate and the step of exposing copper material is performed controlling variation in temperature of the surface of the substrate within ±4° C.

In addition, the step of exposing copper material is preferably performed at a temperature which is lower than that at which the thin copper film is formed.

Further, the step of exposing copper material preferably includes a step of heat-treating the underlying film at a temperature which is higher than that at which the thin copper film is formed.

The step of exposing copper material is preferably repeated several times.

As described above, in the method of forming the thin copper film in accordance with the present invention, exposure treatment of copper material is performed before formation of the thin copper film. In the exposure treatment, the underlying film is exposed to copper material in vapor phase at a prescribed temperature, so that copper material can be applied on the entire surface of the underlying film with almost uniform thickness. Thus, in forming the thin copper film, nucleus of copper material can almost uniformly be produced on the entire surface of the underlying film. As a result, the thin copper film can be formed on the surface of the underlying film with almost uniform thickness and high adhesion.

Figure 6:
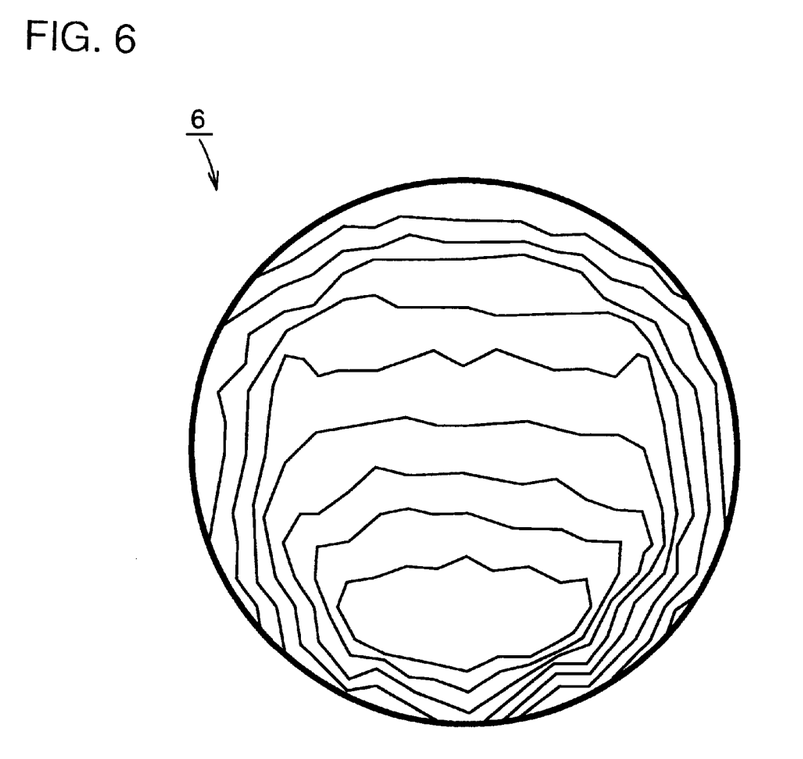
FIG. 6 is a diagram showing thickness distribution of a thin copper film when it is formed on the surface of a semiconductor wafer as a substrate in accordance with a method described in conjunction with a second embodiment of the present invention.

In addition, when the above mentioned exposure treatment is performed with the underlying film formed on the substrate and with variation in temperature of the surface of the substrate maintained within the range of about ±4° C., copper material can more uniformly be applied on the surface of the underlying film. Thus, in addition to the above described effects, as shown in FIG. 6, the thin copper film can be formed on the substrate (a semiconductor wafer 6 in FIG. 6) with almost uniform thickness. As a result, the thin copper film with reduced surface roughness is obtained.

In addition, when the above mentioned exposure treatment is performed at a temperature which is lower than that at which the thin copper film is formed, copper material can be applied on the underlying film while avoiding reaction therewith. Thus, as described above, the thin copper film can be formed on the underlying film with high adhesion.

Further, when heat treatment is performed at a temperature which is higher than that at which the thin copper film is formed after the exposure treatment, a composite layer which is formed of the material for the underlying film and copper can be obtained between the above mentioned nucleus and the underlying film. When the underlying film is formed, for example of TiN, in the composite layer, copper exists between grain boundaries of TiN. The composite layer still remains after formation of the thin copper film, thereby further increasing adhesion between the thin copper film and the underlying film after film formation.

When the exposure treatment is repeated several times, copper material can be applied on the surface of the underlying film more uniformly and closely. Thus, the nucleus is produced more uniformly and closely on the surface of the underlying film after application of copper material. This enables formation of the thin copper film on the underlying film with high adhesion and uniform thickness.

The semiconductor device with the thin copper film in accordance with the present invention includes an insulation film formed on the semiconductor substrate, a thin copper film formed in the insulation film and an underlying film. The underlying film is formed between the thin copper film and the insulation film in tight contact with the surface of the thin copper film, and includes metal with high melting point or nitride thereof.

If the thin copper film is formed by the above mentioned method, nucleus density in forming the thin copper film can be increased. Thus, any space between the underlying film and the thin copper film is prevented. As a result, electromigration life time for the thin copper film is increased to provide interconnection with enhanced reliability.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Referring to FIGS. 1 to 9, embodiments of the present invention will be described.

First Embodiment

Referring now to FIGS. 1 to 4, an embodiment of the present invention will be described.

Figure 1:
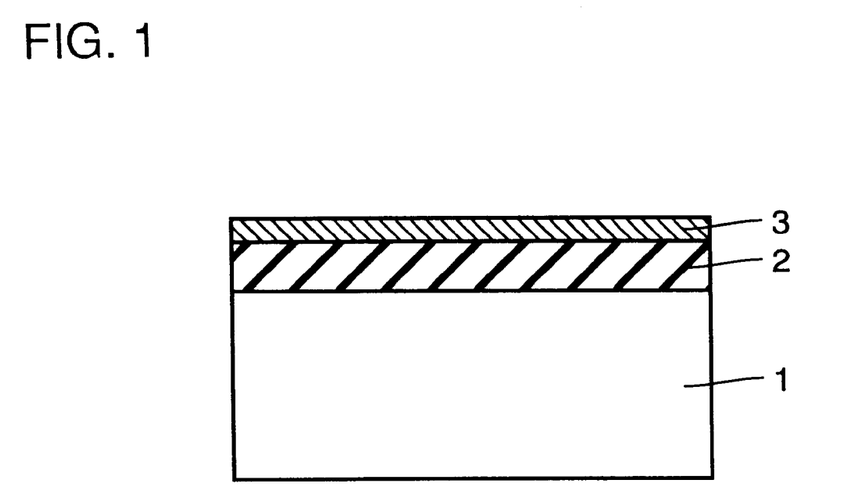
FIGS. 1 to 4 are cross sectional views showing first to fourth steps in a method of forming a thin copper film in accordance with a first embodiment of the present invention.

Referring to FIG. 1, a silicon oxide film 2 and a TiN film 3 are sequentially formed on a surface of a silicon substrate 1 by means of CVD or the like. Silicon oxide film 2 and TiN film 3 have thickness of for example about 500 nm and 10 nm, respectively.

Figure 2:
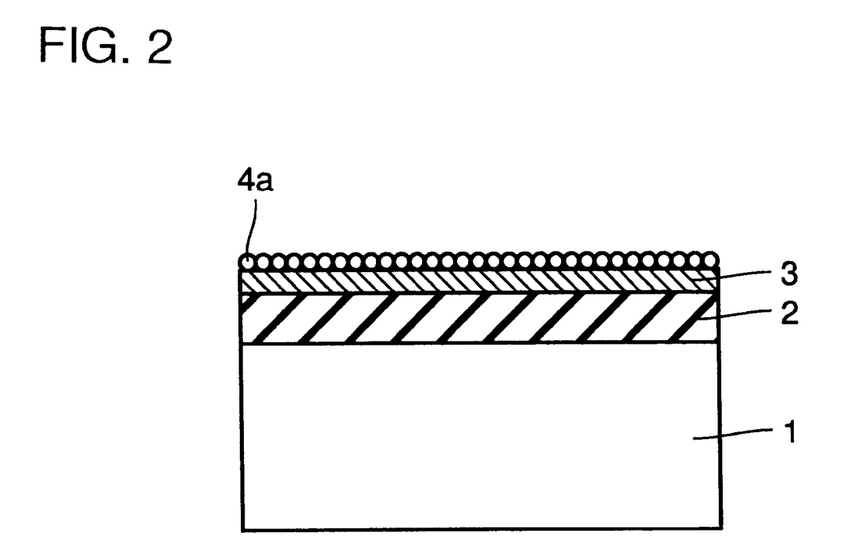

Then, copper material 4a is exposed to the surface of TiN film 3 as shown in FIG. 2. In other words, copper material 4a is applied on the surface of TiN film 3 while avoiding reaction therewith. The condition required at the time is specified in the following Table 1.

TABLE 1

| | |
|---|---|
| temperature of substrate | 30° C. |
| pressure | 18 Torr |
| material flow rate Cu (hfac) (tmvs) | 0.5 g/min |
| cariier flow rate ($H_2$) | 500 sccm |
| exposure time | more than two minutes |

It is noted that while the required temperature of the substrate is about 30° C. according to the above Table 1, any other temperature may be employed so long as it allows copper material 4a to be applied on an underlying film such as TiN film 3 while avoiding reaction therewith. For example, copper material 4a can be applied on the surface of TiN film 3 while avoiding reaction therewith at a temperature which is lower than that of the substrate, which allows formation of the thin copper film as will be later described.

Figure 3:
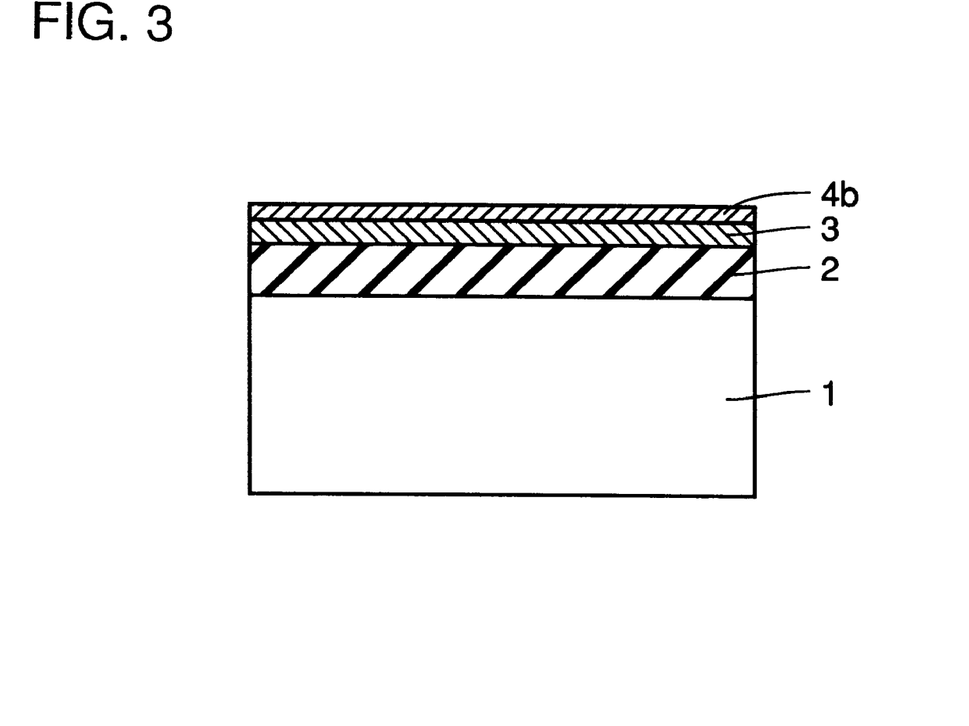

Then, the temperature of silicon substrate 1 is increased, for example, to about 180° C. Thus, a nucleus 4b including copper material 4a is formed on the surface of TiN film 3 as shown in FIG. 3. After the formation of nucleus 4b, thin copper film 4 is formed under the condition shown in the following Table 2.

TABLE 2

| | |
|---|---|
| temperature of substrate | 180° C. |
| pressure | 18 Torr |
| material flow rate Cu (hfac) (tmvs) | 0.2 g/min |
| carrier flow rate ($H_2$) | 500 sccm |

As shown in Table 2 above, the temperature of the substrate is maintained at a temperature which is higher than that at which copper material 4a is exposed. In this example, the temperature of the substrate is shown as maintained at about 180° C. Other temperatures may also be employed as long as it allows production and growth of nucleus 4b by reaction of copper material 4a. In addition, flow rate of copper material 4a in forming thin copper film 4, shown in Table 2, is lower than that in exposing copper material 4a. Thus, by suitably controlling flow rate of copper material 4a in accordance with the treatment, larger amount of copper material 4a can be applied on the surface of underlying TiN film 3 to promote production of nucleus 4b, thereby facilitating growth of thin copper film 4.

Figure 4:
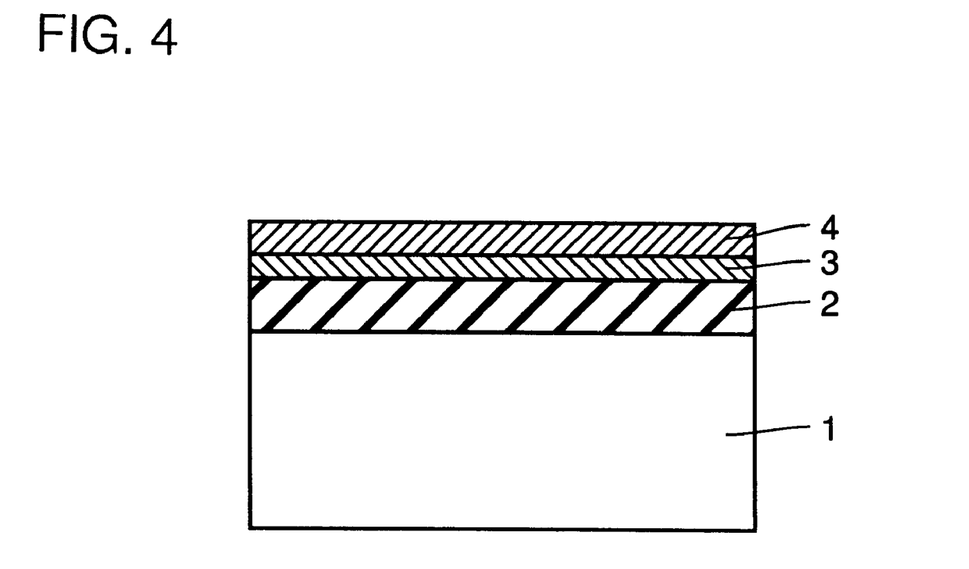

After forming thin copper film 4 in a manner as described above, silicon substrate 1 is cooled down to a prescribed temperature. Then, silicon substrate 1 is removed from a CVD furnace. Through the process hereinbefore, thin copper film 4 is formed on silicon substrate 1 with TiN film 3 interposed.

The inventor of the present invention evaluated adhesion strength between thin copper film 4 and TiN film 3 after thin copper film 4 was formed in accordance with the above described method. The evaluation result is shown in the following Table 3. It is noted that in the evaluation, two types of thin copper films 4, which had been formed on TiN films 3 with or without the exposure treatment in accordance with the present invention, were prepared, and adhesive tapes were attached to each of thin copper films 4. Then, by taking off the tapes, evaluation was made as to if thin copper film also came off from TiN film 3.

TABLE 3

| exposure treatment | test with tape |
| --- | --- |
| performed | ○ |
| not performed | x |

As shown in Table 3, it was verified that thin copper film 4 remained on TiN film 3 after the adhesive tape was removed from thin copper film 4 with the exposure treatment performed in accordance with the present invention. This means that formation of thin copper film 4 by the above described method can increase adhesion strength between thin copper film 4 and TiN film 3.

It is noted that a similar result would be obtained even if other kind of metal with high melting point, including W, Ta, Ti, Cr, Mo, or nitride thereof is employed instead of the above mentioned TiN film 3. In addition, the above or later described film formation method may also be applicable in forming a conductive layer other than copper film 4.

Second Embodiment

Figure 5:
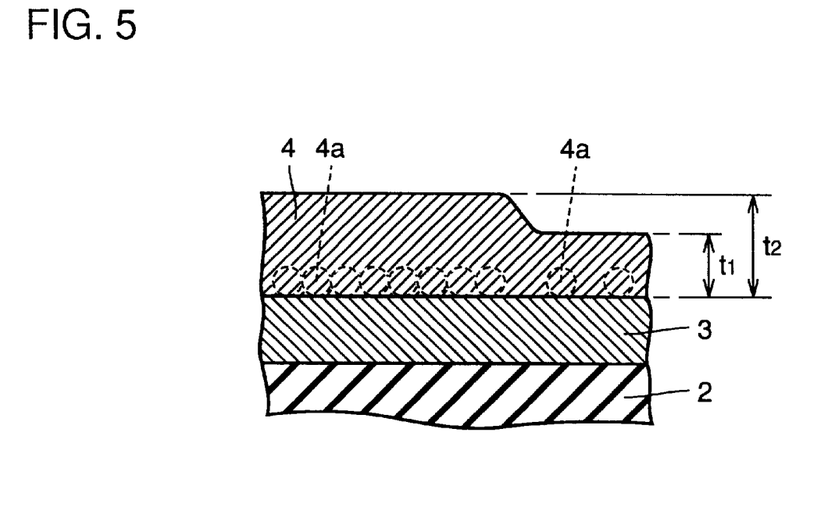
FIG. 5 is a cross sectional view related to the problem when copper material is unevenly applied on the surface of an underlying TiN film.

Referring to FIGS. 5 and 6, a second embodiment of the present invention will now be described. FIG. 5 is a cross sectional view showing a problem concerned when variation in temperature of the surface of the substrate is significant during exposure treatment.

Referring to FIG. 5, copper material 4a is not uniformly applied when there is a variation in temperature of the surface of the substrate which is beyond the prescribed range during the exposure treatment. Thus, nucleus 4b will also unevenly be formed on the surface of TiN film 3 after application of copper material 4a. Referring to FIG. 5, the resulting thin copper film 4 has portions respectively having relatively small and large thicknesses t1 and t2, whereby surface roughness of thin copper film 4 is increased. As a result, characteristics of the thin copper film when used as interconnection or the like may deteriorate.

Accordingly, silicon substrate 1 is controlled so that variation in temperature of the surface thereof is within the prescribed range. More specifically, a heater for heating a substrate, for example of a hot plate type, is prepared and silicon substrate I is pressed against the hot plate for heating (cooling). Here, heating (cooling) for middle and periphery portions of the hot plate can be independently controlled, and a contact portion between the hot plate and silicon substrate 1 is provided with increased heat uniformity by employing an aluminum member. In addition, gas is introduced into the back surface of silicon substrate 1 for heating by heat conduction. It is noted that cooling is performed by circulating cooled He using a chiller.

In accordance with the above described method of controlling temperature of silicon substrate 1, for example, variation in temperature of the surface of silicon substrate 1 is maintained within the range of about ±4° C. FIG. 6 shows thickness distribution of the thin copper film obtained for exposure treatment with the temperature of silicon substrate 1 maintained within such temperature range, subsequently followed by formation of thin copper film 4. It is noted that FIG. 6 is related to thin copper film 4 formed on the surface of semiconductor wafer 6 of six inches, which is used as the above mentioned silicon substrate 1.

As a result, thin copper film 4 had average thickness $d_{av}$ of 4190.5 Å and uniformity ($\sigma/d_{av}$) of 6.6%. It is apparent that controlling variation in temperature of the surface of the substrate, i.e., of semiconductor wafer 6 in FIG. 6, within the range of about ±4° C. for exposure treatment not only provides enhanced adhesion with the underlying film but also enables formation of thin copper film 4 with reduced surface roughness. Consequently, interconnection with enhanced characteristics is obtained if thin copper film 4 thus formed is used as interconnection.

Third Embodiment

Now, a third embodiment of the present invention will be described. While temperature of the substrate is set at 30° C. in the above first embodiment, there may be a suitable range for temperature of the substrate. Then, the preferred range for temperature of the substrate during exposure treatment is discussed in the present third embodiment.

In the exposure treatment in accordance with the present invention, copper material 4a is applied on the surface of the underlying film while avoiding reaction therewith as described above. Thus, exposure treatment is preferably performed within the range of the temperature at which copper material 4a stably exists without liquefying and reaction between copper material 4a and the underlying film(for example, TiN film 3) is avoided. Therefore, exposure treatment is preferably performed within the range of temperature of the substrate between about 5° C. and about 30° C. Most preferably, it is performed within the range between about 5° C. and about 20° C. Thus, copper material 4a can most effectively be applied on the surface of the underlying film.

It is noted that the condition for exposure treatment in the present third embodiment is shown in the following Table 4.

TABLE 4

| | |
| --- | --- |
| temperature of substrate | more than 5° C. and less than 20° C. |
| pressure | 18 Torr |
| material flow rate Cu (hfac) (tmvs) | 0.5 g/min |
| carrier flow rate (H$_2$) | 500 sccm |
| exposure time | more than two minutes |

Fourth Embodiment

Figure 7:
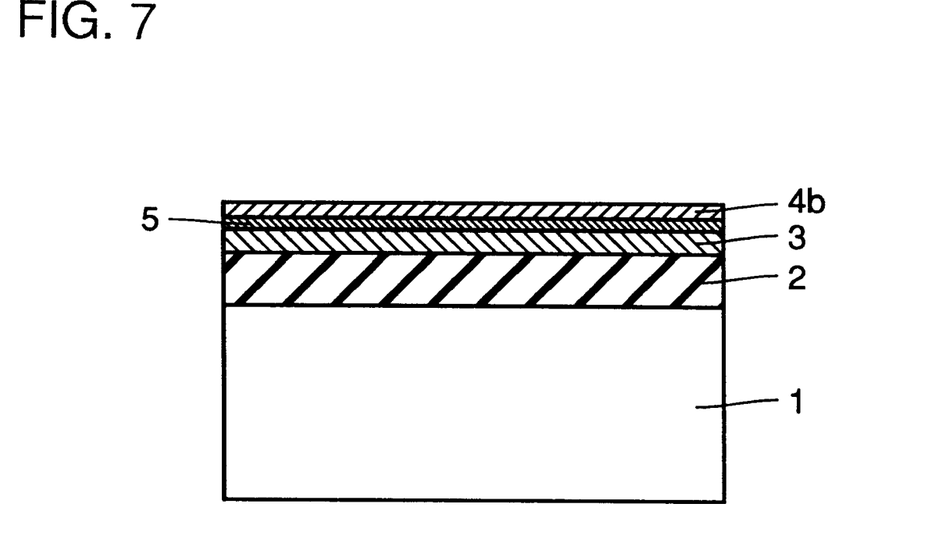
FIGS. 7 and 8 are cross sectional views showing characteristic first and second steps in a method of forming a thin copper film in accordance with a fourth embodiment of the present invention.
Figure 8:
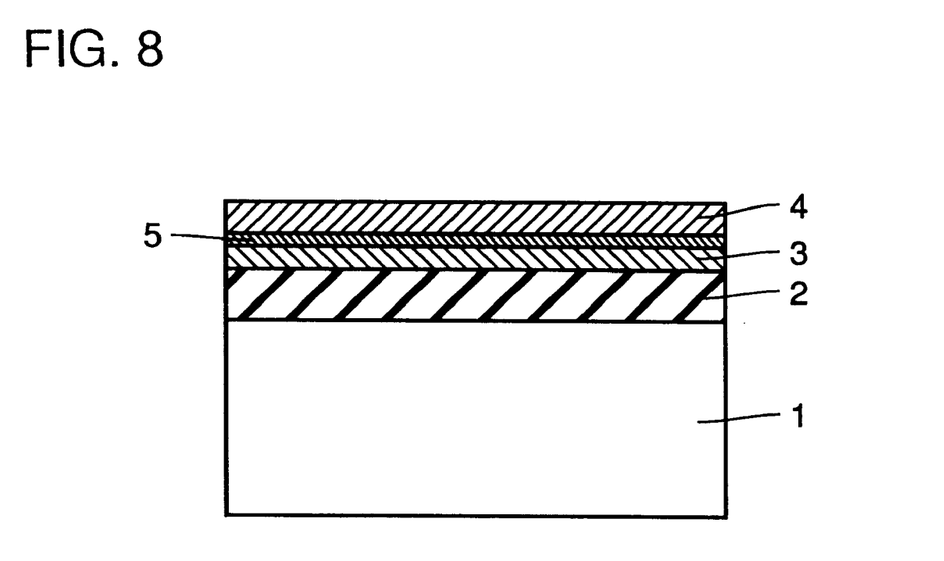

Referring now to FIGS. 7 and 8, a fourth embodiment of the present invention will be described. FIGS. 7 and 8 are cross sectional views showing the characteristic first and second steps in a method of forming thin copper film 4 in accordance with the fourth embodiment of the present invention.

According to the fourth embodiment, a process for copper material 4a proceeds up to the exposure treatment in a similar manner as in the above described first embodiment. Then, thermal treatment at the temperature for example of about 200° C. to about 450° C. is performed for copper material 4a and TiN film 3 after exposure treatment. It is noted that the thermal treatment needs to be performed at a temperature which is higher than that for forming the thin copper film 4 (for example of about 180° C.), which will be later described. As shown in FIG. 7, the thermal treatment under such temperature forms nucleus 4b including copper material 4a, and a composite layer 5 of copper and TiN is formed between nucleus 4b and TiN film 3. Composite layer 5, where copper atoms exist between grain boundaries of TiN, can provide enhanced adhesion strength between TiN film 3 and thin copper film 4, which will be later formed.

After thermal treatment for forming composite layer 5 as described above, thin copper film 4 is formed under a similar condition as in the first embodiment. As a result, a structure shown in FIG. 8 is obtained.

Fifth Embodiment

A fifth embodiment of the present invention will now be described. The fifth embodiment is characterized in that the exposure treatment in accordance with the present invention is repeated several times. By repeating exposure treatment several times, copper material 4a can be more closely applied on the surface of TiN film 3.

Thus, nucleus 4b is closely produced, thereby allowing efficient formation of thin copper film 4. In addition, copper material 4a can be applied on the surface of underlying TiN film 3 more uniformly, so that nucleus 4b is more uniformly produced. As a result, efficient formation of thin copper film 4 as well as enhanced adhesion strength between thin copper film 4 and TiN film 3 is achieved.

It is noted that exposure treatment may be repeated several times either under the same or different conditions. In addition, when thermal treatment is performed after exposure treatment as in the above described fourth embodiment, both treatments may be repeated several times. After thus repeating exposure treatment several times, thin copper film 4 is formed in a similar manner as described in each of the above embodiments.

Figure 9:
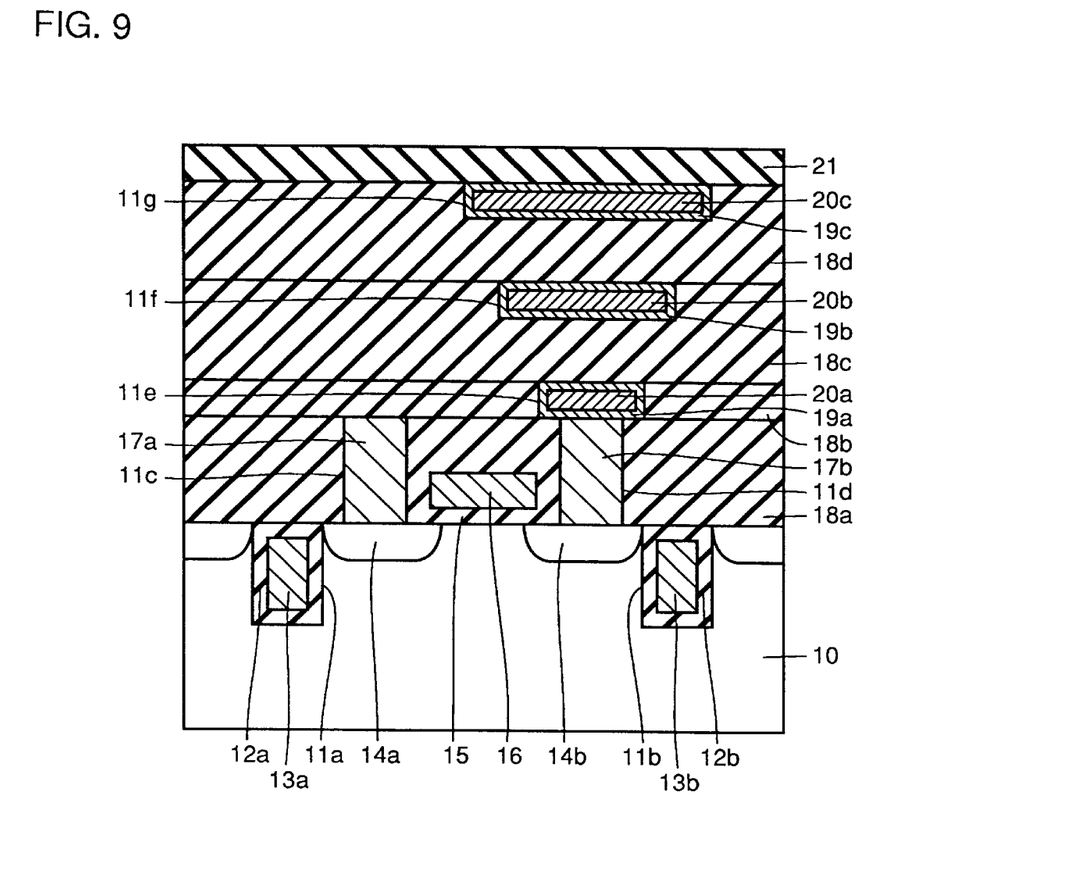
FIG. 9 is a cross sectional view showing an exemplary semiconductor device (DRAM) to which the method of forming the thin copper film in accordance with the present invention can be applied.

Referring now to FIG. 9, an application of the present invention will be described. FIG. 9 is a cross sectional view showing a DRAM (Dynamic Random Access Memory) to which the method of forming thin copper film 4 in accordance with the present invention is applicable.

Referring to FIG. 9, impurity diffusion regions 14a and 14b are formed spaced apart in the main surface of a silicon substrate 10. A gate electrode 16 is formed on a channel region defined by impurity diffusion regions 14a and 14b with a gate insulation film 15 interposed. Trenches 11a and 11b for insulation of elements are formed in the main surface of silicon substrate 10. Polysilicon films 13a and 13b are formed in trenches 11a and 11b with insulation films 12a and 12b interposed, respectively.

Formed to cover the main surface of silicon substrate 10 is an interlayer insulation film 18a, in which contact holes 11c and 11d are formed which are respectively continuous to impurity diffusion regions 14a and 14b. Plug electrodes 17a and 17c of for example W are formed in contact holes 11c and 11d, respectively.

An interlayer insulation film 18b is formed to cover interlayer insulation film 18a, and a via hole lie is formed in interlayer insulation film 18b. A TiN film 19a is formed in via hole 11c which functions as a barrier. A copper interconnection 20a is formed on TiN film 19a. Thus, the method of forming the thin copper film in accordance with the present invention can be applied in forming copper interconnection 20a on TiN film 19a.

Thus, nucleus density in forming copper interconnection 20a is increased, so that any space between underlying TiN film 19a and copper interconnection 20a can be prevented. As a result, reliability (electromigration life time) of copper interconnection 20a is increased.

An interlayer insulation film 18c is formed to cover interlayer insulation film 18b, and a trench 11f is formed in interlayer insulation film 18c. A copper interconnection 20b is formed in trench 11f with a TiN film 19b interposed. An interlayer insulation film 18d is further formed to cover interlayer insulation film 18c, and a trench 11g is also formed in interlayer insulating film 18d. In addition, a copper interconnection 20c is formed in trench 11g with a TiN film 19c interposed. The passivation film 21 is formed to cover copper interconnection 20c and interlayer insulation film 18d. The method of forming the thin copper film in accordance with the present invention may also be applicable to formation of the above mentioned copper interconnections 20c and 20b.

It is noted that in FIG. 9, while copper interconnections 20a, 20b and 20c are disclosed as being formed through a damascene process contemplated for forming a copper interconnection of submicron level, the present invention may also be applied to other applications. The above mentioned damascene process is described, for example, in "Interconnection Process Employing Damascene Method" published in monthly magazine *Semiconductor World*, December, 1995.

As in the foregoing, although the embodiments or application of the present invention has been described, it is considered that the present invention may be applied to formation of a conductive film other than the thin copper film. In addition, the embodiment disclosed herein are all by way of illustration and example only and is not to be taken by way of limitation. The scope of the present. invention is limited only by the terms of the appended claims, and any alteration in the meaning and scope equivalent to the appended claims is included.

What is claimed is:

1. A method of forming a thin copper film on an underlying film including metal with high melting point or nitride thereof, comprising:

exposing copper material to a surface of said underlying film at a first temperature lower than that at which said copper material reacts with said underlying film;

heating said copper material at a temperature where nuclei of copper are formed after the exposure of said copper material; and growing the thin copper film from said nuclei on said underlying film.

2. The method of forming the thin copper film according to claim 1, wherein said underlying film is formed on a substrate, and said step of exposing said copper material is performed while controlling variation in temperature of the surface of said substrate within a range of ±4° C.

3. The method of forming the thin copper film according to claim 1, wherein said step of exposing said copper material is performed at a temperature lower than that at which said thin copper film is formed.

4. The method of forming the thin copper film according to claim 1, wherein said step of exposing said copper material includes a step of performing thermal treatment for said underlying film at a temperature higher than that at which said thin copper film is formed after the exposure of said copper material.

5. The method of forming the thin copper film according to claim 1, wherein said step of exposing said copper material is repeated several times.

* * * * *

UNITED STATES PATENT AND TRADEMARK OFFICE
CERTIFICATE OF CORRECTION

PATENT NO.    : 6,303,495 B2
DATED         : October 16, 2001
INVENTOR(S)   : Takeshi Mori et al.

It is certified that error appears in the above-identified patent and that said Letters Patent is hereby corrected as shown below:

<u>Title page, Item 54, and Column 1, lines 1-3,</u>
Change the title from "METHOD OF FORMING THIN COPPER FILM AND SEMICONDUCTOR DEVICE WITH THIN COPPER FILM" to -- METHOD OF FORMING THIN COPPER FILM --.

Signed and Sealed this

Eighteenth Day of June, 2002

*Attest:*

*Attesting Officer*

JAMES E. ROGAN
*Director of the United States Patent and Trademark Office*